United States Patent [19]

Homma

[11] 4,164,791

[45] Aug. 14, 1979

[54] SEMICONDUCTOR MEMORY WITH EQUAL WORD LINE AND REFERENCE LINE VOLTAGE DROP

[75] Inventor: Noriyuki Homma, Kokubunji, Japan

[73] Assignee: Hitachi, Ltd., Japan

[21] Appl. No.: 860,092

[22] Filed: Dec. 13, 1977

[30] Foreign Application Priority Data

Dec. 17, 1976 [JP] Japan ................................. 51/150943

[51] Int. Cl.² .......................... G11C 7/00; G11C 11/40
[52] U.S. Cl. ........................................ 365/190; 365/155
[58] Field of Search ................. 365/154, 155, 189, 190

[56] References Cited

U.S. PATENT DOCUMENTS

| | | | |
|---|---|---|---|
| 3,745,540 | 7/1973 | Taniguchi et al. | 365/154 |
| 4,078,261 | 3/1978 | Millhollan et al. | 365/189 |

*Primary Examiner*—Stuart N. Hecker
*Attorney, Agent, or Firm*—Craig and Antonelli

[57] ABSTRACT

A semiconductor memory includes a plurality of memory cells connected between word line pairs and between the digit line pairs in matrix form. To compensate for voltage drops developed along the word line, there are provided current sources, each of which is connected to a reference line to supply constant currents equal in value to the current flowing through the word line. Moreover, another current source is connected to a word addressing voltage drive circuit to compensate for voltage drops developed along the digit line.

10 Claims, 10 Drawing Figures

SEMICONDUCTOR MEMORY WITH EQUAL WORD LINE AND REFERENCE LINE VOLTAGE DROP

BACKGROUND OF THE INVENTION

The present invention relates to a semiconductor memory and in particular to a circuit for compensating for voltage drops along word lines and digit lines so as to allow the memory to be operated over a wide operational range.

A semiconductor memory, such as a bipolar memory, comprises a number of memory cells arranged in matrix form. With the progress of LSI (Large Scale integration) technology, it has become possible to form a considerably large number of cells in a single chip. As a result, wirings between memory cells have been necessarily reduced in size, both in width and thickness. Word lines and digit lines made of aluminum are usually designed in this field to be 5 to 10 $\mu$m in width at the present time. It is expected in the near future that these lines may be reduced as small as 1 to 5 $\mu$m in width.

However, fine wiring structure results in some problems with the normal operation of the semiconductor memory. One of them is that the voltage drops developed along word lines and digit lines are not negligibly small because of the relatively high resistance of these lines. Especially, this disadvantage may be enhanced when the memory cells are provided with large current flowing there-through in order to realize a high-speed memory.

SUMMARY OF THE INVENTION

Accordingly, the object of the present invention is to eliminate or compensate for the adverse affect of the above-mentioned voltage drop on the operation of the semiconductor memory.

In order to achieve the object, one embodiment of the present invention is characterized by current sources connected to reference lines for producing voltage drops therealong to compensate for voltage drops due to holding currents flowing through word lines.

In another embodiment, further current sources are connected to reference lines to compensate for voltage drops due to digit line current flowing by way of memory cells to the word lines.

The other objects and features of the present invention will become apparent from the detailed description when read in conjunction with accompanying drawings.

DESCRIPTION OF THE PREFERRED EMBODIMENTS

Figure 1:
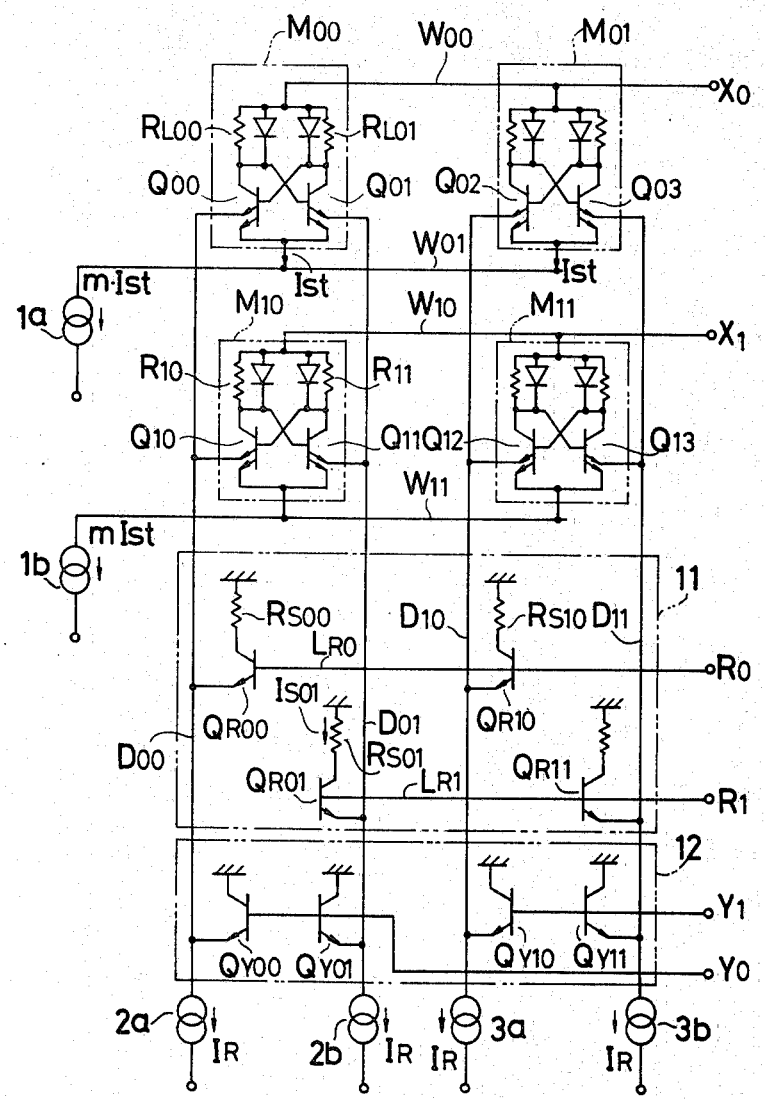
FIG. 1 is a circuit diagram showing one of the typical bipolar memories.

For the purpose of better understanding of the present invention, a typical bipolar memory will be first explained by referring to FIG. 1.

Although a memory array typically includes a large number of memory cells in the form of matrix, FIG. 1 shows memory cells in a reduced array of only two rows and two columns for ease of explanation. Each of the memory cells consists of a pair of cross-coupled transistors. For example, the memory cell $M_{00}$ consists of transistors $Q_{00}$, $Q_{01}$ having collectors connected through resistors $R_{L00}$, $R_{L01}$ to a word line $W_{00}$ respectively, first emitters connected to digit lines $D_{00}$, $D_{01}$, respectively and second emitters coupled in common. The common emitter of each of memory cells $M_{00}$, $M_{01}$ ..., $M_{0m}$ arranged in a row is connected to a current source $1a$ which supplies a total of mx Ist constant current in order to provide a holding current Ist to each of M memory cells. The current Ist serves to hold the state of memory cells during operating cycle. The other memory cells $M_{10}$, $M_{11}$, ... $M_{1m}$ arranged in the second row are connected in a similar way to the another current source $1b$.

Numerals 11 and 12 denote a sense circuit and a digit addressing control circuit, respectively.

The sense circuit 11 includes a first pair of transistors $Q_{R00}$, $Q_{R01}$ connected at their emitter electrodes to the digit lines $D_{00}$, $D_{01}$ and at their base electrodes to terminals $R_0$, $R_1$ by way of lines $L_{R0}$, $L_{R1}$ respectively, and a second pair of transistors $Q_{R10}$, $Q_{R11}$ connected at their emitter electrodes to the digit lines $D_{10}$, $D_{11}$ and at their base electrodes to terminals $R_0$, $R_1$ through lines $L_{R0}$, $L_{R1}$ respectively.

The digit addressing control circuit 12 comprises pairs of transistors $Q_{Y00}$, $Q_{Y01}$ and $Q_{Y10}$, $Q_{Y11}$, having emitter electrodes connected to the digit lines $D_{00}$, $D_{01}$ and $D_{10}$, $D_{11}$, and base electrodes connected in common to the terminals $Y_0$ and $Y_1$ respectively. Constant current sources $2a$, $2b$, $3a$, $3b$ are connected to the digit lines $D_{00}$, $D_{01}$, $D_{10}$, $D_{11}$ respectively to provide constant current $I_R$ flowing through each digit line.

Figure 2:
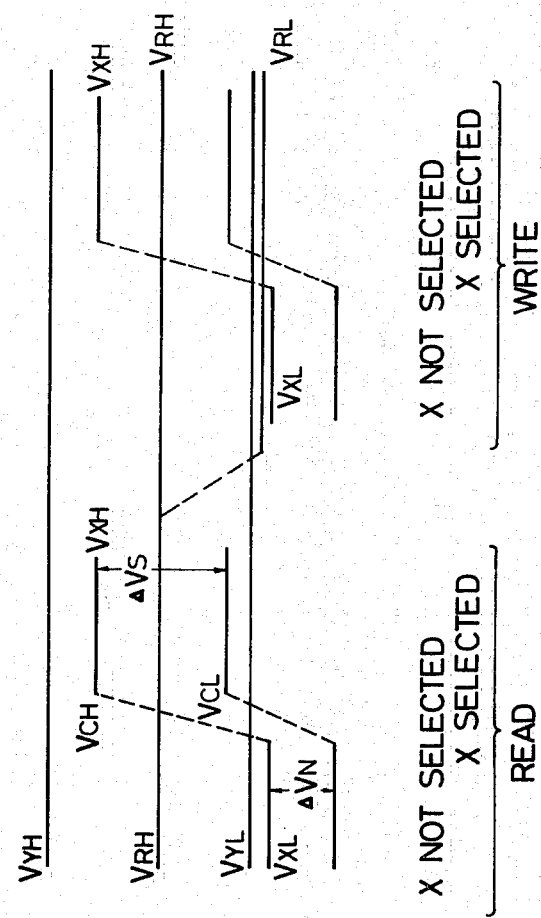
FIG. 2 shows the relationship of potentials applied to the word line and the digit line.

Now, the reading operation will be explained with reference to FIG. 2.

Assume that the memory cell $M_{00}$ is to be selected for reading while the remaining cells such as $M_{01}$, $M_{10}$ and $M_{11}$ are not. The memory cell $M_{00}$ is arbitrarily defined as storing information of a logic "0" when the transistor $Q_{00}$ is turned on and the transistor $Q_{01}$ turned off. Alternatively, it is defined as storing a logic "1" when the transistor $Q_{00}$ is turned off and the transistor $Q_{01}$ turned on. For the purpose of exemplary explanation, it is assumed hereinafter that a logic "0" is stored in the memory cell $M_{00}$.

During the reading cycle of the selected cell $M_{00}$, potentials shown at $V_{XH}$, $V_{XL}$, $V_{YL}$, $V_{YH}$ and $V_{RH}$ are respectively applied to the terminals $X_0$, $X_1$, $Y_0$, $Y_1$ and R.

The potential at the collector electrode of the turned-off transistor $Q_{01}$ as well as at the base electrode of the turned-on transistor $Q_{00}$ is nearly equal to potential $V_{XH}$ at the terminal $X_0$. On the other hand, the collector electrode of the transistor $Q_{00}$ as well as the base electrode of the transistor $Q_{01}$ is at a potential equal to $(V_{XH}-\Delta V_s)$ volts, where $\Delta V_s$ indicates the voltage drop developed across the resistor $R_{L00}$.

The constant current $I_R$ provided by means of the current source $2a$ is permitted to flow through one of transistors $Q_{00}$, $Q_{10}$, $Q_{R00}$ and $Q_{Y00}$ connected to the digit line $D_{00}$, whose base electrode is at the highest the potential. As will be apparent from FIG. 2, potential $V_{XH}$ at the base electrode of the transistor $Q_{00}$ is higher than any other potentials at the bases of the transistors $Q_{10}$, $Q_{R00}$ and $Q_{Y00}$; therefore, the current $I_R$ can flow through the transistor $Q_{00}$.

As a result, the transistor $Q_{R00}$ turns off, whereby a high level potential (equal to ground potential) is developed at the collector electrode of the transistor $Q_{R00}$.

On the other hand, the constant current $I_R$ provided by means of the current source $2b$ flows through either one of transistors $Q_{01}$, $Q_{11}$, $Q_{R01}$, and $Q_{Y01}$, whose base electrode is at the highest potential.

The base electrodes of these transistors $Q_{01}$, $Q_{11}$, $Q_{R01}$ and $Q_{Y01}$ are at potentials of $(V_{XH}-\Delta V_s)$, $V_{XL}$ (or $V_{XL}-\Delta V_N$), $V_{RH}$ and $V_{YL}$, respectively. Therefore, the constant current $I_R$ is permitted to pass through the transistor $Q_{R01}$ whose base potential is higher than any other base potentials of the transistors connected to the digit line $D_{01}$. As a result, the collector of the transistor $Q_{R01}$ is at low potential of about $(-I_{S01} \times R_{S01})$ volts.

Next, another case is assumed where the transistor $Q_{00}$ of the memory cell $M_{00}$ is turned off and the transistor $Q_{01}$ turned on to store information of a logic "1". In this case, the transistor $Q_{R00}$ is turned on, so that low potential appears at the collector electrode thereof, while the transistor $Q_{R01}$ is turned off so that its collector is held at a high potential.

It will be understood from above discussion that information stored in the memory cell $M_{00}$ can be sensed as potentials at the collectors of the transistors $Q_{R00}$ and $Q_{R01}$.

On the other hand, the following operation is achieved with respect to the other memory cells $M_{01}$, $M_{11}$ which are not selected.

When the memory cell $M_{00}$ is selected, a pair of transistors $Q_{Y10}$, $Q_{Y11}$ are supplied at their base electrodes with a potential $V_{YH}$ which is higher than any other potentials at base electrodes of the transistors $Q_{02}$, $Q_{12}$, $Q_{R10}$, $Q_{03}$, $Q_{13}$ and $Q_{R11}$. Consequently, regardless of the information stored in the cells $M_{01}$, $M_{11}$, the constant currents $I_R$ provided by means of the current sources $3a$ and $3b$ are respectively permitted to pass through the transistors $Q_{Y10}$ and $Q_{Y11}$. As a result, the transistors $R_{R10}$ and $Q_{R11}$ are both turned off, so that high potential (equal to ground potential) appears at their collectors. This means that the information stored in the memory cells $M_{01}$, $M_{11}$ can not be read out when the memory cell $M_{00}$ is selected.

Now, the writing operation of the memory will be described.

It will be assumed that the information of a logical "1" is to be written into the memory cell $M_{00}$ which now stores a logical "0". In this case, the terminals $Y_0$, $Y_1$, $X_0$ and $X_1$ are given potentials shown at $V_{YL}$, $Y_{YH}$, $V_{XH}$ and $V_{XL}$, respectively. Furthermore, the terminals $R_0$ and $R_1$ are at potentials of $V_{RH}$ and $V_{RL}$, respectively.

It is noted that the potential at the base electrode of the transistor $Q_{01}$ is higher than any other potentials at the base electrodes of the transistors $Q_{11}$, $Q_{R01}$ and $Q_{01}$ regardless of the information stored in the selected cell $M_{00}$; therefore, he constant current $I_R$ flows through the transistor $Q_{01}$. The constant current $I_R$ is usually selected in value to be larger than the current Ist so that the states of the transistors of memory cell can be determined by the current $I_R$ rather than Ist.

In consequence, the transistor $Q_{01}$, through which the constant current $I_R$ flows, is turned on, while the transistor $Q_{00}$ is turned off. Therefore, the writing of a logical "1" into the selected cell $M_{00}$ is achieved.

In a similar manner, when information of a logical "0" is to be written into the selected cell $M_{00}$, potentials $V_{RH}$ and $V_{RL}$ are applied to the terminals $R_0$ and $R_1$, respectively, thereby turning the transistor $Q_{00}$ on and turning the transistor $Q_{01}$ off.

The other memory cells not selected are not affected by the operation of the writing as will be explained hereinafter. When the memory cell $M_{00}$ is selected, the base electrodes of the transistors $Q_{Y10}$ and $Q_{Y11}$ are given a potential indicated at $V_{YH}$ in FIG. 2, which is higher than any other potentials at the base electrodes of the transistors connected to the digit lines $D_{10}$ and $D_{11}$. Accordingly, the constant currents $I_R$ provided by means of the current sources $3a$ and $3b$ are permitted to pass through the transistors $Q_{Y10}$ and $Q_{Y11}$ respectively, regardless of the information stored in the cells $M_{01}$ and $M_{11}$. This means that the memory cells not selected do not receive any influence during the writing cycle.

As mentioned above, the great progress of LSI technology makes it possible to form a large number of memory cells in a single semiconductor chip. As a result, word and digit lines are necessarily required to be reduced in both width and thickness. As a matter of fact, these lines will be of 1 to 5 $\mu$m in width in the near future. However reduction in size of wirings such as word lines and digit lines causes serious problems because of the relatively large resistance thereof. For example, if the word line is of 1 $\mu$m in width, 1 $\mu$m in thickness and 5 mm in entire length, the resistance becomes as large as 137.6 $\Omega$. When the current of 5 mA flows through this word line, a voltage drop as large as about 700 mV is developed along the word line.

This voltage drop is large enough to cause incorrect operation of the semiconductor memory, since the potential appearing at the memory cell is usually lower than 1 volt in level. Referring to FIG. 2, when the potential of $V_X$ ($=V_{XH}-V_{XL}$) is equal to 1 volt, it is almost impossible to set the potential $V_{RH}$ at the intermediate point between $V_{CH}$ and $V_{CL}$, if voltage drop developed along the word line is as large as 700 mV.

Figure 3:
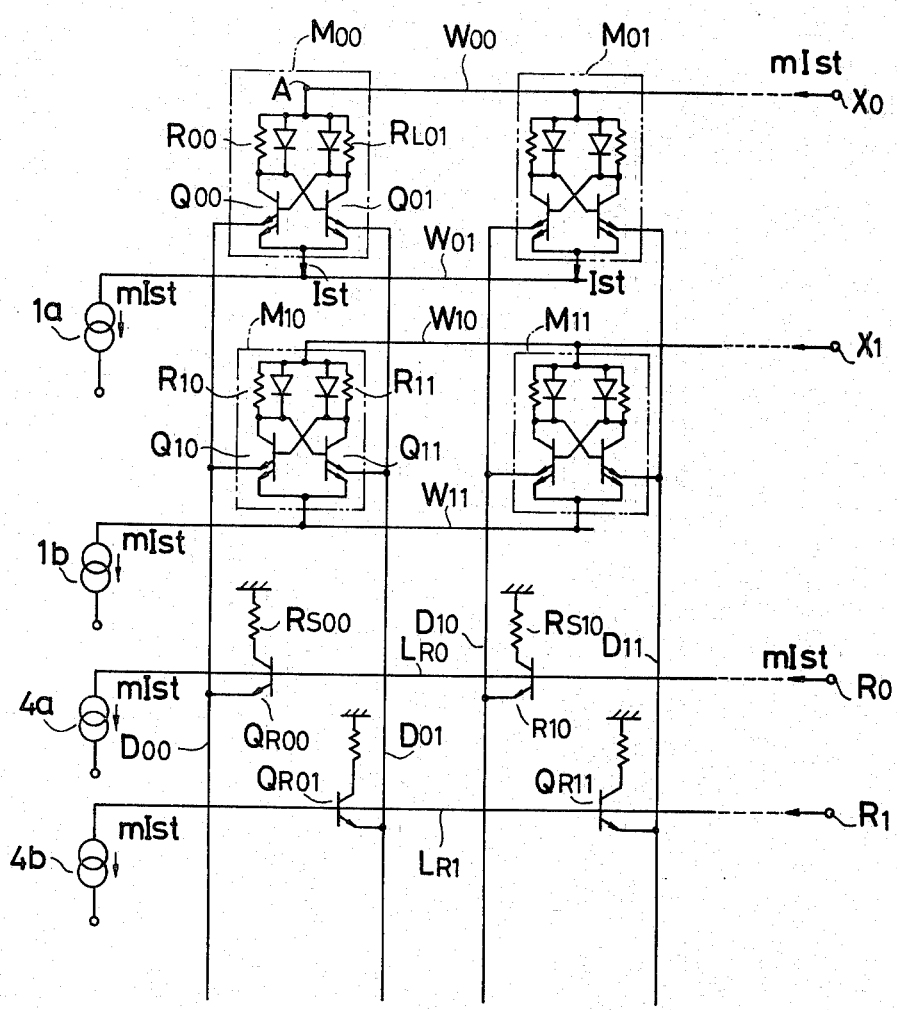
FIG. 3 is a circuit diagram of an embodiment of the invention for compensating for voltage drops due to the holding current $I_{ST}$.

Accordingly, the present invention can provide means for normal or correct operation of the memory circuit even if a relatively large voltage drop is developed along word and digit lines. Referring now to FIG. 3, one of the preferred embodiments of the present invention will be explained. The improvement according to this embodiment is to compensate for voltage drops due to the holding current (mx Ist) flowing through each word line.

In order to accomplish the operation of reading or writing, potentials at the base electrodes of the transistors of the selected memory cell have to be compared with reference potentials applied by way of reference line $L_R$ to the base electrodes of the transistors which are connected between a pair of digit lines. However, due to the holding current which flows through the word line, developing voltage drops therealong, the potential actually applied to the memory cell is different from the potential at the terminal X to which the word addressing voltage is applied. For example, even if the voltage $V_{HX}$ is applied to the terminal $X_0$ so as to select the memory cell $M_{00}$ for reading or writing, the voltage actually applied to the memory cell $M_{00}$ becomes equal to $V_{HX}$ minus voltage drop $V_{AX0}$ developed along the word line A–$X_0$. On the other hand, no current flows through reference line $L_R$ in the circuit of FIG. 1, so that the transistor $Q_R$ is applied at its base electrode with a potential substantially equal to the reference voltage applied to the terminal R. This will possibly cause an incorrect operation in comparing base electrode potentials of the transistors $Q_{00}$, $Q_{01}$ with those of transistors $Q_{R00}$ and $Q_{R01}$.

In order to eliminate above-mentioned problem, the embodiment of the present invention is characterized by the provision of current sources 4a, 4b, ... respectively connected to reference lines $L_{R0}$, $L_{R1}$ so as to allow the predetermined constant current flowing through each of the reference lines. Where the reference line is made of the same material such as aluminum of the same width and thickness as that of word line, each of the current sources 4a, 4b, ... can be designed to provide a total current of (mx Ist) so that the voltage drop developed along the reference line can be substantially equal to the voltage drop along the word line.

According to this embodiment, although potentials such as $V_{HX}$, $V_{CH}$, $V_{RH}$ are different in their absolute values from memory cell to memory cell, the relative potentials between memory cells become substantially equal to each other so that the operation of reading and writing can be correctly achieved.

It should be noted in this embodiment that if the reference line is designed to have a different width and thickness from those of the word line, each of the current sources 4a, 4b, ... should be designed to have different current capacity rather than (mx Ist). Since the important consideration is to produce the same voltage drop along the reference line as developed along the word line, the current source 4 should be designed to provide an appropriate current taking into account the material, size and specific resistance etc. of those lines.

Figure 4:
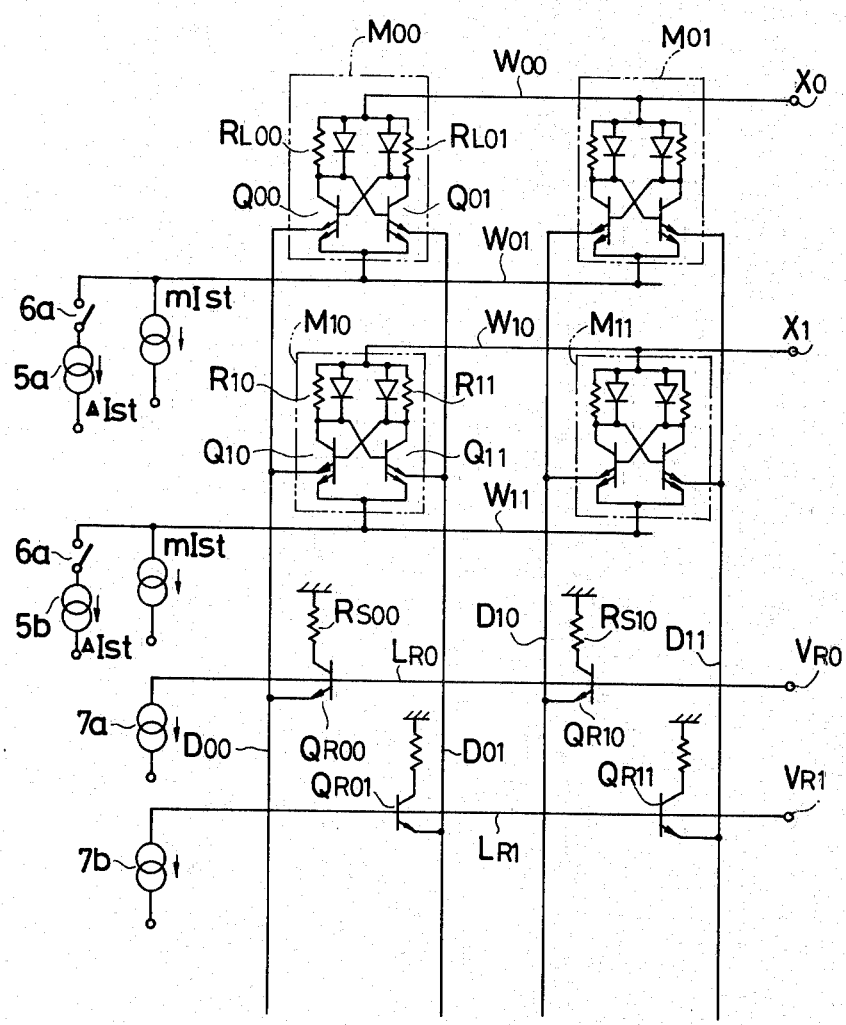
FIG. 4 is another circuit diagram of an embodiment of the invention for compensating for the voltage drop due to the holding current $I_{ST}$.

For the purpose of ease of the explanation, however, all the wirings of the memory array are hereinafter assumed to be of the same material and of the same size. FIG. 4 shows semiconductor memory according to another embodiment of the invention.

For the provision of a large capacity memory capable of being operated at high speed, one useful technique has been known in which only the word and digit lines connected to the selected cell are supplied with large current, while the other lines connected to the memory cells not selected are provided with small current necessary to hold information therein. To realize such a technique, the memory circuit of FIG. 4 includes further current sources 5a, 5b, ... connected by way of switches 6a, 6b, ... to the word lines $W_{01}$, $W_{11}$, ... respectively. When the word addressing voltage $V_{HX}$ is applied to the terminal $X_0$, switch 6a is closed to pass current ΔIst through the memory cells $M_{00}$, $M_{01}$, ... in addition to the normal holding current Ist. In order to provide high-speed access time of the memory, the current source 5 may be designed to supply the constant current equal to more than ten times the current Ist.

With such a memory circuit, a considerably large voltage drop developed along the word line makes it almost impossible to achieve correct or normal operation for reading and writing.

The embodiment of the invention, however, gives an effective solution to this problem by means of current sources 7a, 7b, ... connected to the reference lines $L_{R0}$, $L_{R1}$, ... respectively. In this embodiment, each of the current sources 7a, 7b, ... is designed to provide a constant current of m Ist plus ΔIst.

Figure 5:
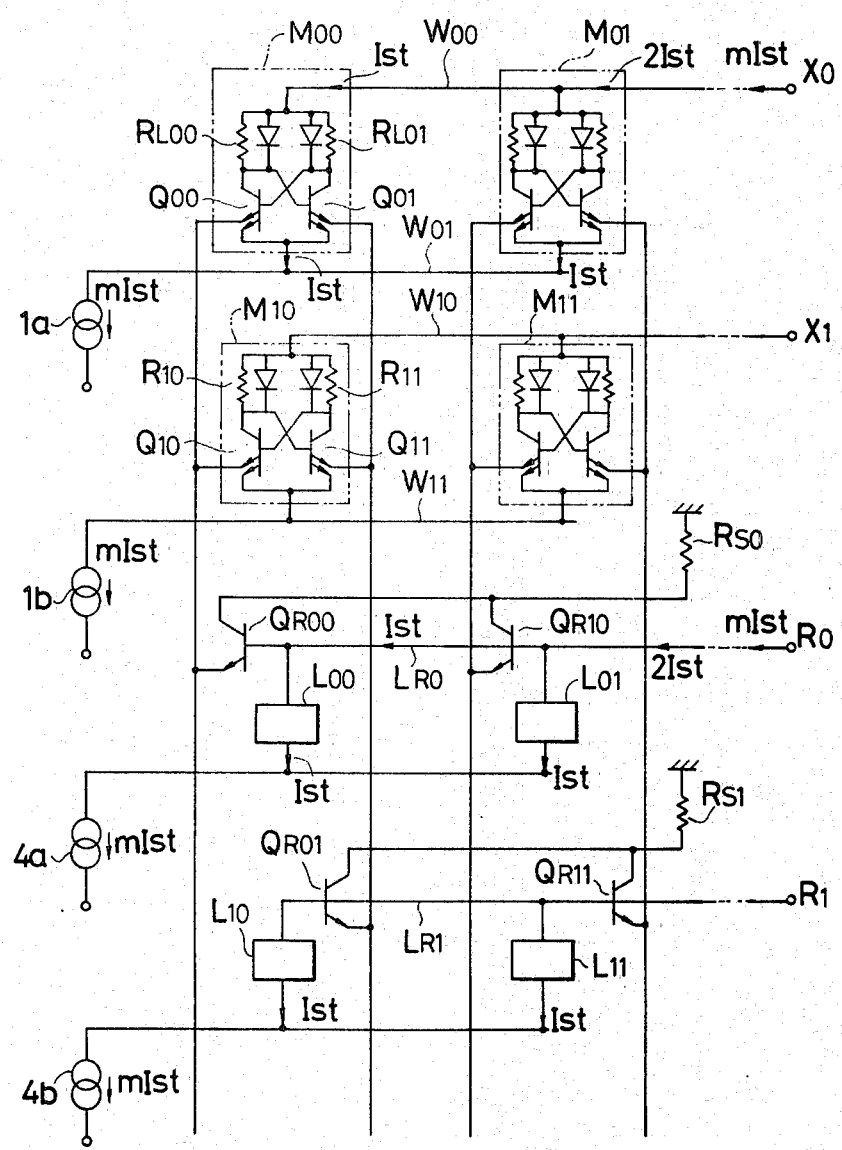
FIG. 5 is a further diagram of an embodiment of the invention for compensating for the voltage drop due to the holding current $I_{ST}$.

FIG. 5 illustrates further embodiment of the invention.

Precisely speaking, the memory circuit according to FIG. 3 is effective to compensate for voltage drops developed along the word line, but may not be sufficient to completely compensate therefor.

This is because while the constant current (m Ist) flows through the entire reference line $L_R$, the current flowing through the word line is different in value from place to place. For example, a current of Ist flows through the word line connecting between the first memory cell $M_{00}$ and the second cell $M_{01}$, a current of 2 Ist flows through the word line connecting between the second cell $M_{01}$ and the third cell $M_{02}$ (not shown) and so on.

In other words, the voltage drop is developed along the reference line in proportion to the length thereof. However, since the total current of m Ist is equally divided into m to pass the current Ist through each of m memory cells arranged in a row, the voltage drop developed along the word line has linear relationship with respect to the length of the word line.

In order to eliminate this disadvantage, the embodiment of FIG. 5 includes the current sources 4a, 4b, ..., each of which is connected by way of impedance circuits L to he reference line $L_R$. The impedance circuits are connected in a row in the same manner as the arrangement of the memory cells so that the current Ist can flow in the same way through both the word and reference lines. As a result, the distribution of voltage drops along the reference line becomes considerably similar to that of voltages drop along the word line, so that complete compensation can be accomplished.

In this embodiment, the impedance circuit L is desirable to be the same circuit configuration as the load of the memory cell. In practice, however, it may be composed of a resistor.

Figure 6:
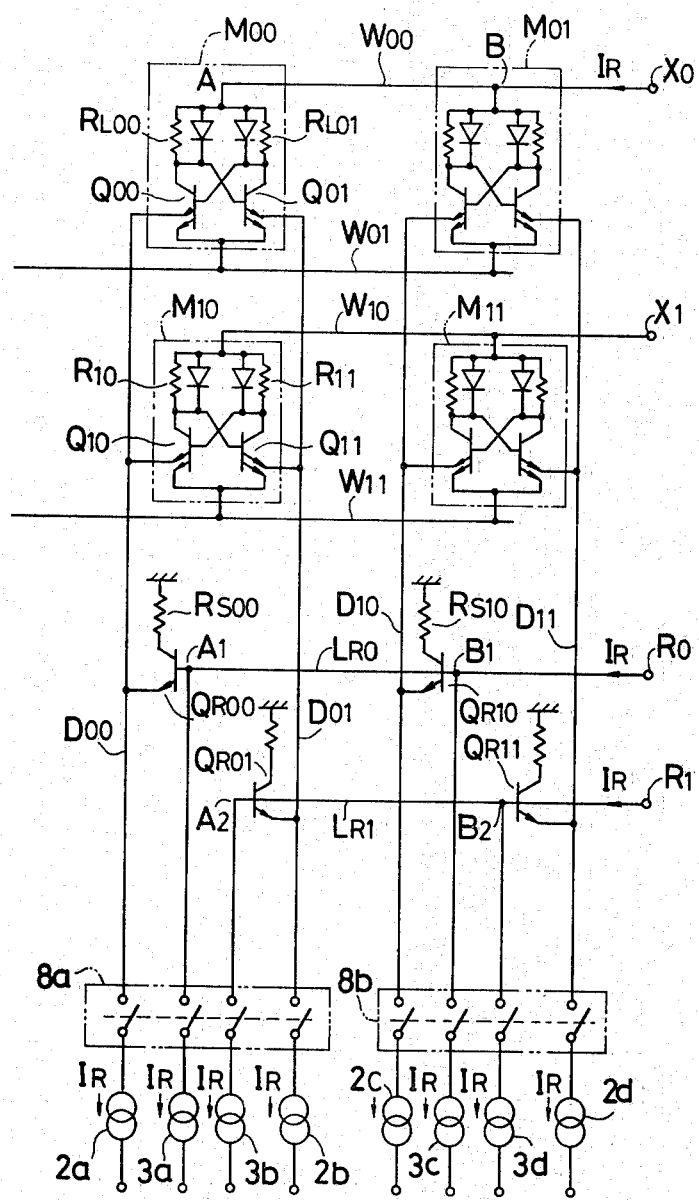
FIG. 6 is a circuit diagram of an embodiment of the invention for compensating for a voltage drop due to the current $I_R$.

FIG. 6 shows memory circuit according to another embodiment of the present invention.

All the embodiments discussed above are directed to compensate for voltage drop due to the holding current Ist flowing through the word line. It is noted, however, that the voltage drop developed along the word line is due to not only the holding current Ist, but also due to a constant current $I_R$ provided by means of each of the current sources 2a, 2b, 2c, 2d. Therefore, if the constant current $I_R$ is comparable in its value with the holding current Ist or more, it is desirable to compensate for the voltage drop due to the current $I_R$.

It should be noted that unlike the holding current Ist, the constant current $I_R$ provided by the current source 2 flows by way of different portion of the word line, depending upon the selection of the memory cell for reading or writing.

For example, when the memory cell $M_{00}$ is selected, the current $I_R$ flows by way of the word line $W_{00}$ between the points A and $X_0$ to the memory cell $M_{00}$. On the other hand, when the memory cell $M_{01}$ is selected, the current $I_R$ flows through the word line portion connecting between the points B and $X_0$ and does not flow through the line portion between the points A and B.

Accordingly, in order to compensate for voltage drops developed due to the current $I_R$, the same current $I_R$ is required to pass through the reference line portion corresponding to the word line portion through which the current $I_R$ is passing.

For this purpose, the embodiment of FIG. 6 includes current sources $3a$, $3b$, $3c$, $3d$, each of which provide the same constant current $I_R$ as provided by means of the current sources $2a$, $2b$, $2c$, $2d$. The current sources $3a$, $3c$ are connected through switches $8a$, $8b$ to the reference line $L_{R0}$, respectively, while the current sources $3b$, $3d$ are connected through switches $8a$, $8b$ to the reference line $L_{R1}$, respectively.

When the memory cell $M_{00}$ is selected for writing or reading, the switch $8a$ is closed to provide the current $I_R$ flowing through each of the reference line portions $A_1$–$R_0$ and $A_2$–$R_1$. On the other hand, when the memory cell $M_{01}$ is selected, the switch $8b$ is closed so that the current $I_R$ flows through the reference line portions $B_1$–$R_0$ and $B_2$–$R_1$ respectively.

The voltage drop developed along the line portion $A_1$–$R_0$ as well as $A_2$–$R_1$ is made substantially equal in value to the voltage drop along the word line portion A–$X_0$, while the voltage drop of line portion $B_1$–$R_0$ as well as $B_2$–$R_1$ is made equal to that of line portion B–$X_0$. As a result, the voltage drop developed along the word line due to the current $I_R$ can be effectively compensated despite the fact that the voltage drop varies in value depending upon the selection of the memory cell.

Figure 7:
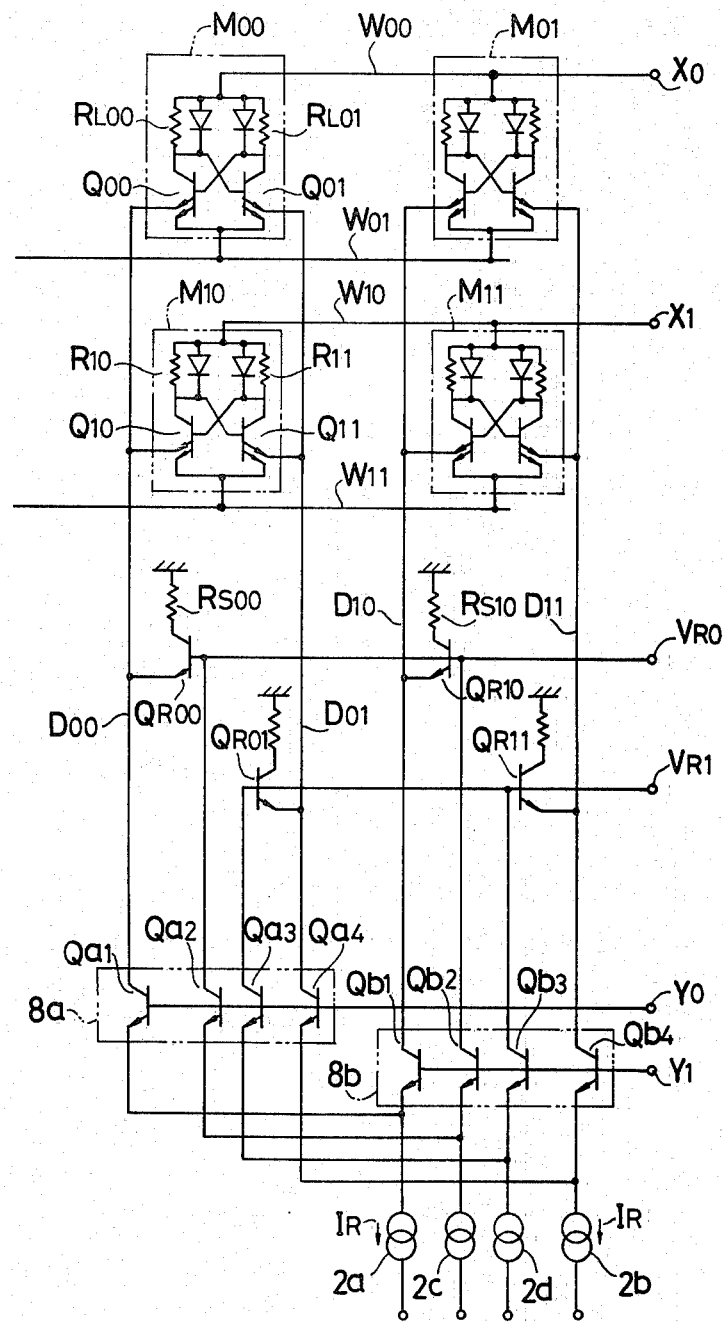
FIG. 7 is another circuit diagram of an embodiment of the invention for compensating for the voltage drop due to the current $I_R$.

FIG. 7 shows the another embodiment of the invention in which current switches are used as the switching circuits $8a$ and $8b$. Transistors $Q_{a1}$, $Q_{a2}$, $Q_{a3}$ and $Q_{a4}$ of the current switch $8a$ are connected at their emitters to the current sources $2a$, $2d$ $2c$ and $2b$ respectively and connected at their base electrodes to the terminal $Y_0$ in common. Transistors $Q_{b1}$, $Q_{b2}$, $Q_{b3}$ and $Q_{b4}$ of the current switch $8b$ are connected at their emitters to the current sources $2a$, $2d$, $2c$ and $2b$ respectively and connected at their base electrodes to the terminal $Y_1$ in common. When one of the memory cells connected between digit line pair $D_{00}$ and $D_{01}$ is selected, all of the transistors $Q_{a1}$ $Q_{a4}$ are turned on while the other transistors are turned off. On the other hand, one of the memory cells connected between the digit line pair $D_{10}$ and $D_{11}$ is selected, all of the transistors $Q_{b1}$ $Q_{b4}$ are turned on. Accordingly, it will be apparent that this embodiment can operate to compensate for the voltage drop in the same manner as described with reference to FIG. 6.

Figure 8:
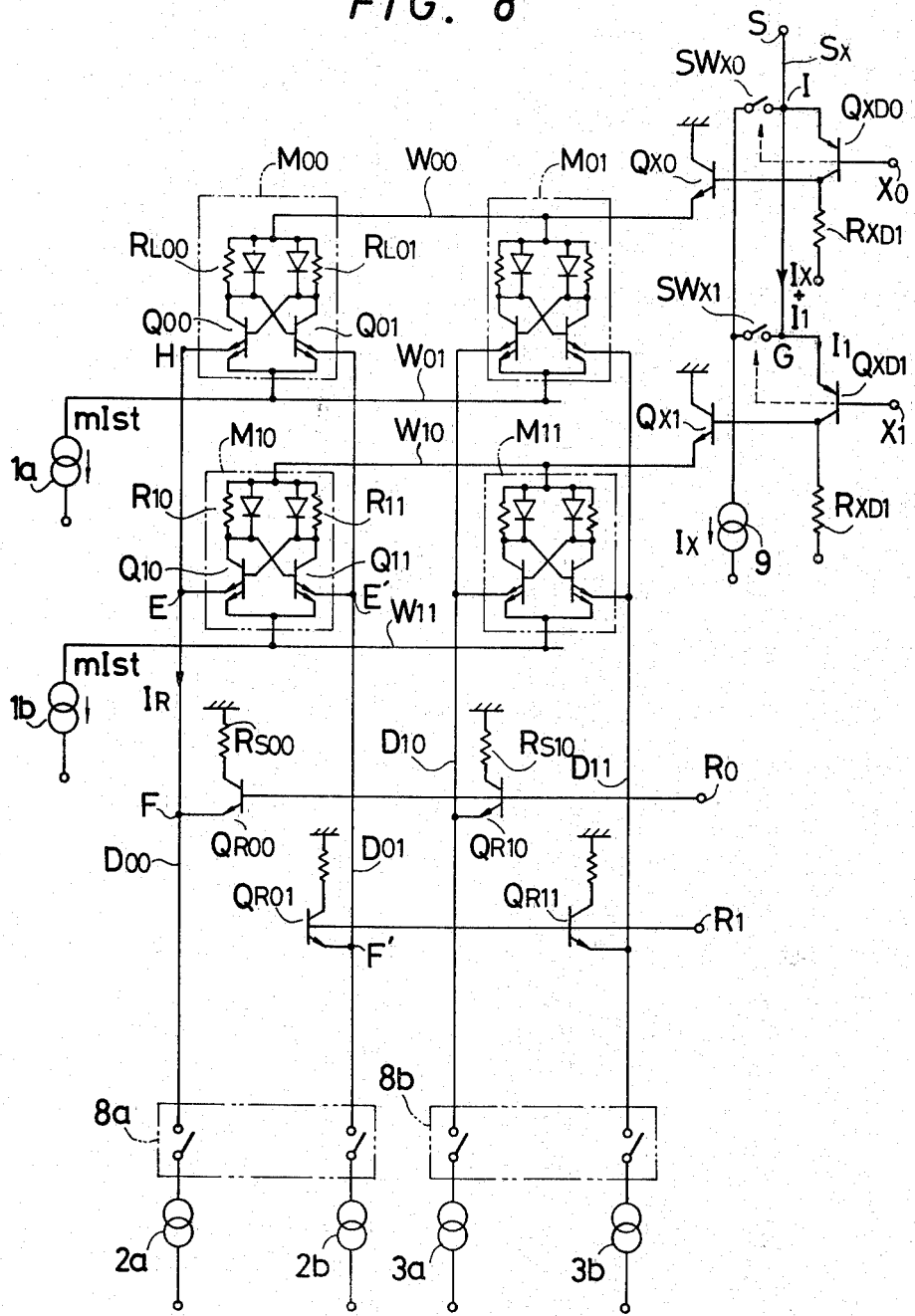
FIG. 8 is still another circuit diagram of an embodiment of the invention for compensating for a voltage drop due to the current $I_R$.

Another embodiment shown in FIG. 8 is directed to compensate for a voltage drop developed along the digit line due to the current $I_R$.

As mentioned above, when one of the memory cells is selected for writing or reading, transistors consisting of the selected memory cell are compared, at their base electrode potentials with transistors $Q_R$ connected to the terminals $R_0$ and $R_1$ as well as other transistors. It is noted that the base electrode potential to be compared in relative to the emitter electrode.

However, the potentials at emitter electrodes of transistors to be compared may be different from each other due to the constant current $I_R$ which causes a voltage drop along the digit line.

For example, when the memory cell $M_{10}$ is assumed to be selected for a writing or reading operation, the transistors $Q_{10}$, $Q_{11}$ are compared in base potentials relative to their emitters with the transistors $Q_{R00}$, $R_{R01}$ respectively. The current $I_R$ flows through either one of digit lines $D_{00}$ and $D_{01}$ depending upon the state of the selected memory cell $M_{10}$. When the transistor $Q_{10}$ is turned on while the transistors $Q_{11}$ turned off, the current $I_R$ flows through the digit line $D_{00}$ so as to develop voltage drop there along.

Therefore, the potential at point E becomes higher by the amount of voltage drop along the digit line portion E-F than the potential at point F.

On the other hand, when the memory cell $M_{00}$ is selected, the potential at point H becomes higher by the amount of the voltage drop along the digit line portion H-F than the potential at point F.

The difference between relative potential at points E and H with respect to point F will possibly cause an erroneous operation for writing or reading.

In order to compensate for the voltage drop along the digit line, this embodiment of the invention is characterized by the provision of a current source 9 connected by way of switches $SW_{X1}$, $SW_{X0}$ to line $S_X$, respectively. The word addressing voltage is selectively applied to one of base electrodes of transistors $Q_{XD0}$, $Q_{XD1}$, .... The transistors $Q_{XD0}$, $Q_{XD1}$, ... are connected at their emitters to line $S_X$, and connected at their collectors to resistors $R_{XD0}$, $R_{XD1}$, respectively. The outputs of the transistor $Q_{XD0}$, $Q_{XD1}$, ... are applied by way of transistors $Q_{X0}$, $Q_{X1}$, ... to the word lines $W_{00}$, $W_{10}$, ..., respectively.

When the memory cell $M_{10}$ is to be selected, the voltage $V_{XH}$ is applied to the terminal $X_1$ while the voltage $V_{XL}$ is applied to each of the other terminals so that only the transistor $Q_{XD1}$ is turned on. At the same time, the switch $SW_{X1}$ is closed while the other switchs remain open.

Consequently the current flows through the line $S_X$ to the first path including the transistor $Q_{XD1}$ and the resistor $R_{XD1}$ as well as to the second path including the switch $SW_{X1}$ and the current source 9. If the current $I_1$ flows through the first path and $I_X$ flows through the second path, the sum of the current $I_1$ and $I_X$ flows through the line $S_X$. Therefore the voltage applied to the word line $W_{10}$ is equal to $\{V_S-(I_1+I_X)R_{SG}-I_1 \cdot R_{CE}\}$ volt, where $V_S$ is the voltage applied to the terminal S, $R_{SG}$ is the resistance of line portion between the points S and G, and $R_{CE}$ is the resistance of collector-emitter path of the transistor $Q_{XD1}$.

On the other hand, when the memory cell $M_{00}$ is selected, the current $(I_X+I_1)$ flows only through the line portion S−I so that the voltage applied to the cell $M_{00}$ becomes equal to $\{V_S-(I_1+I_X)R_{SI}-I_1R_{CE}\}$ volt, where $R_{SI}$ is the resistance of line portion between the points S and I.

Accordingly, the voltage applied to the memory cell $M_{00}$ becomes higher by the amount of voltage drop $V_{IG}$ along the line portion I-G. If the voltage drop $V_{IG}$ is selected to be equal to $V_{HF}$, relative potentials of the base electrode the emitter become substantially equal to each other.

In other words, correct operation for writing and reading can be achieved in spite of the presence of the voltage drop developed along the digit line due to the current $I_R$.

If it is possible to select such a value of the current $I_1$ that the rate of the voltage drop due to the current $I_1$ along the line $S_X$ becomes equal to that due to the current $I_R$ along the digit line, connection of the current source 9 as well as switches SX is not necessarily required.

Figure 9:
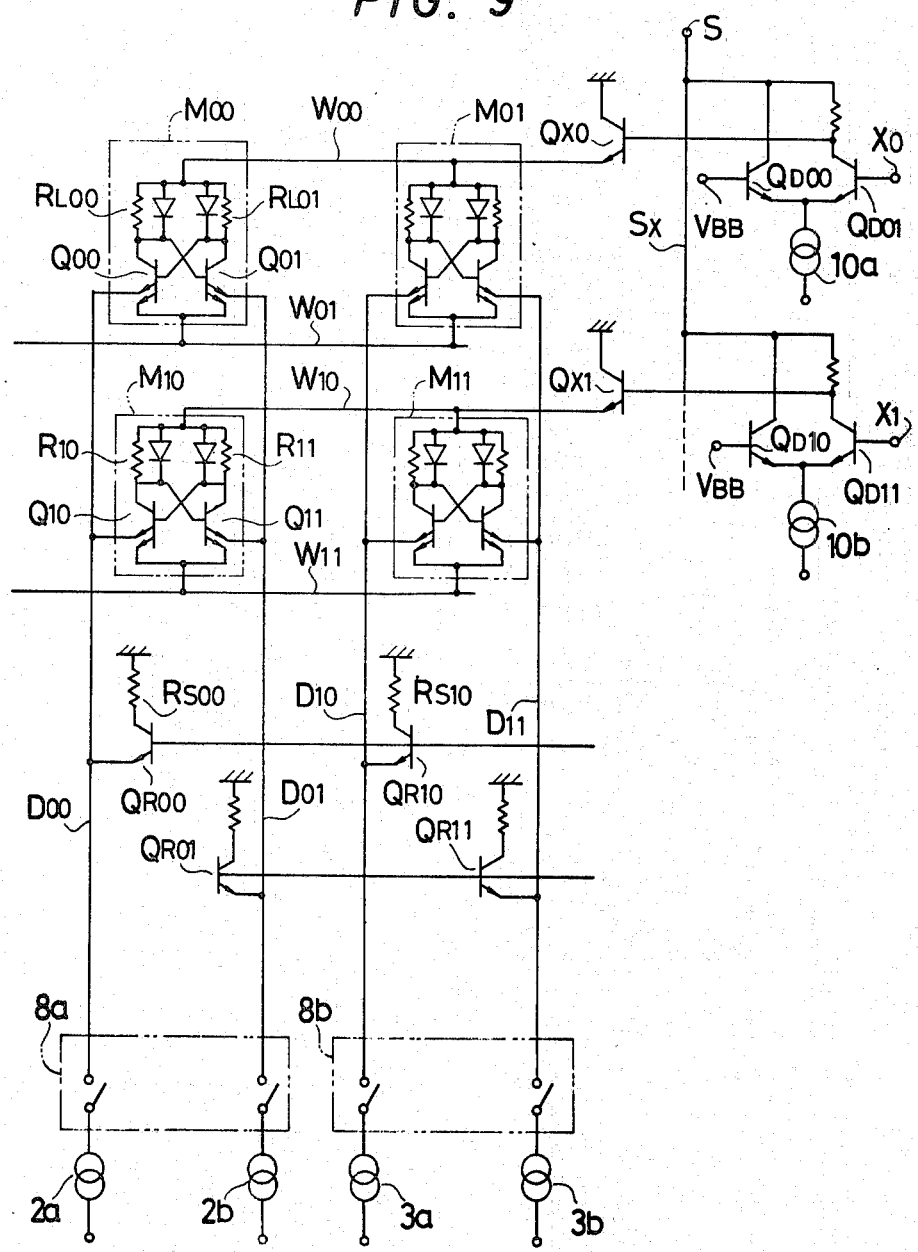
FIG. 9 is an additional diagram of an embodiment of the invention for compensating for voltage drops due to the current $I_R$.

FIG. 9 shows another embodiment of the invention in which current switches are used as word line drive circuits. Each of the current switch comprises a pair of transistors connected at their emitters to the common current source, and connected at their collectors to the voltage source.

Since the circuit configuration and function of this type of the current switch is well know to those skilled in the art, detailed explanation is omitted. In this circuit, the rate of the voltage drop developed along the line $S_X$ is designed to be equal to that of voltage drop along the digit line.

It will be apparent in this circuit that the voltage drop along the digit line can be compensated in the same manner as mentioned with reference to FIG. 8.

Figure 10:
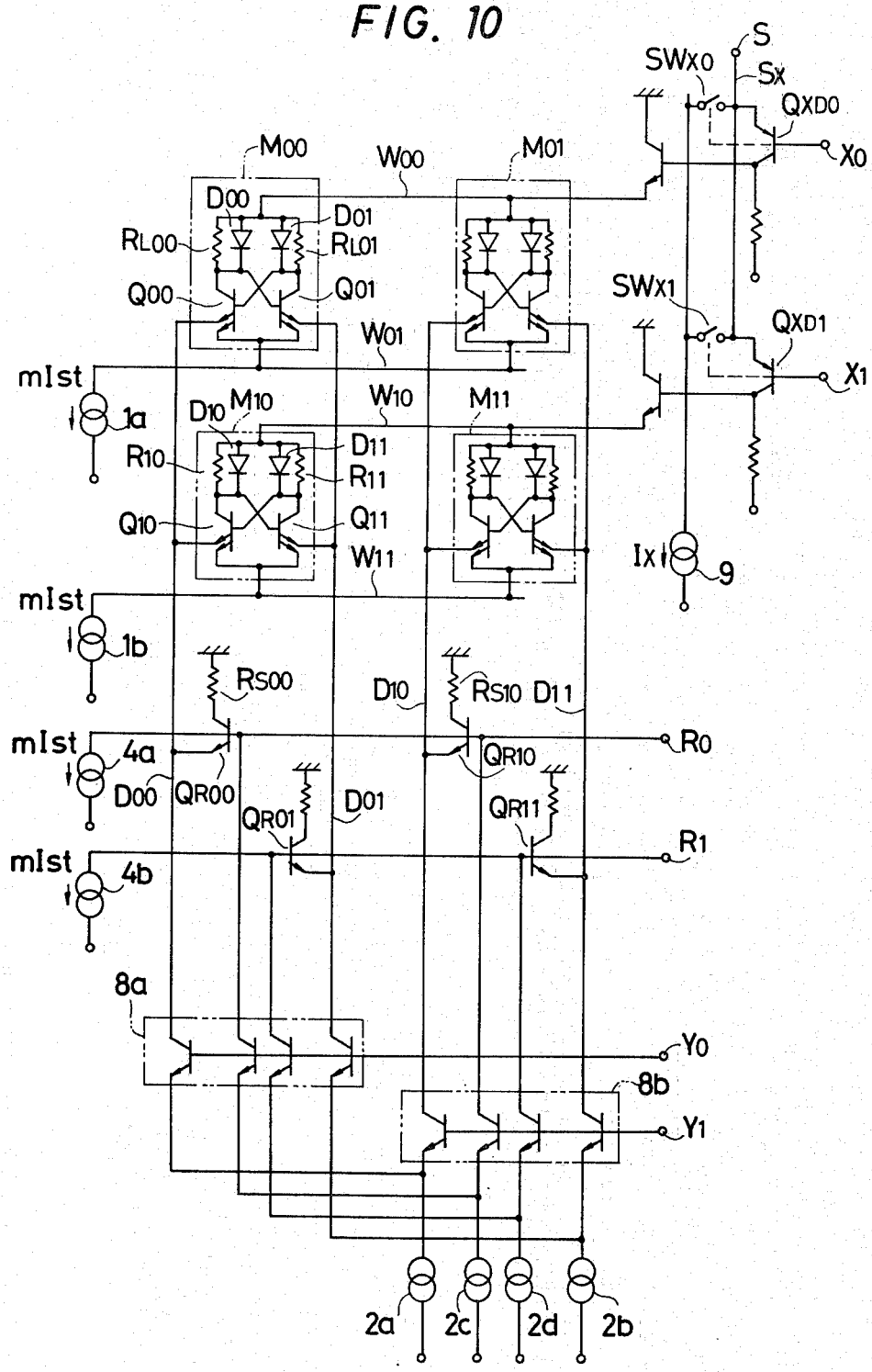
FIG. 10 is circuit diagram showing another embodiment of the invention which is directed to compensate for voltage drop due to both the holding current Ist and the current $I_R$.

FIG. 10 shows a further embodiment of the invention which is aimed at compensating for a voltage drop due to both the word line current and the digit line current at the same time.

As will be apparent from FIG. 3 and its corresponding description, the current sources 4a, 4b serve to compensate for voltage drop developed along the word line due to the holding current m Ist. Further, as will be understood from FIG. 7 the current sources 2c, 2d function to compensate for voltage drop developed along the word line due to the current $I_R$. Moreover, it is clear from FIG. 8 and its corresponding description that the current source 9 serves to compensate for voltage drop developed along the digit line due to the current $I_R$.

Therefore, according to this embodiment of the invention all the undesirable voltage drops due to the word line current and the digit line current can be compensated at the same time.

It should be noted that while several embodiments have been described, the invention is not limited to the particular details of the connections described and variations can be made without departing from the essential features of the invention. It is, accordingly, desired that the appended claims be given a broad interpretation commensurate with the scope of the invention within the art.

I claim:

1. A semiconductor memory comprising:
    a number of memory cells arranged in matrix form, each memory cell being connected between a word line pair and between a digit line pair;
    a sense circuit including a reference line to which a reference voltage is applied, and sense elements connected to both the reference line and the digit line to produce an output in response to the potential on the reference line relative to the potential applied to the memory cell;
    first current source means, each connected to one line of the word line pair, for providing a constant current flowing from one line of the word line pair through each of memory cells to the other line of the word line pair; and
    second current source means, each connected to the reference line, for providing a constant current flowing therethrough to produce along the reference line a voltage drop substantially equal to the voltage drop developed along the word line due to the current provided by means of the first current source.

2. A semiconductor memory according to claim 1, wherein the sense circuit comprises first and second reference lines extending in a direction parallel to the word lines, a first group of transistors each connected at its base electrode to the first reference line, at its emitter electrode to one of the digit line pair and at its collector to a load resistor, and a second group of transistors each connected at its base electrode to the second reference line, at its emitter to the other one of the digit line pair and at its collector to a load resistor.

3. A semiconductor memory according to claim 2, wherein the second current source is connected through an impedance circuit to the connecting point of the reference line and the base electrode of the sense element.

4. A semiconductor memory according to claim 1, wherein the memory cell comprises a pair of cross-coupled transistors having first emitters connected in common to the one line of the word line pair, second emitters connected to the digit line pair and collectors connected by way of resistors to the other line of the word line pair.

5. A semiconductor memory according to claim 1, which further comprises third current source means connected by way of switching means to the word line for providing additional current to the memory cells.

6. A semiconductor memory comprising:
    a number of memory cells arranged in matrix form, each memory cell being connected between a word line pair and between a digit line pair;
    a sense circuit including a reference line to which a reference voltage is applied and sense elements connected to both the reference line and the digit line to produce an output in response to the potential on the reference line relative to the potential applied to the memory cell;
    first current source means each connected to the digit line for supplying a constant current flowing from the digit line through the memory cell to one line of the word line pair; and
    second current source means connected to the reference line, for providing a constant current therethrough to produce along the reference line a voltage drop substantially equal to the voltage drop developed along the word line due to the current provided by means of said first current source.

7. A semiconductor memory according to claim 6, which further comprises switching means for selectively applying the constant currents provided by means of said first and second current sources, in accordance with the selection of the memory cell.

8. A semiconductor memory according to claim 7, wherein the switching means comprises a plurality of transistors having emitters connected to said first and second current sources respectively, collectors connected to the digit line and the reference line, respectively, and bases connected in common to the terminal to which the digit line addressing voltage is applied.

9. A semiconductor memory comprising:

a number of memory cells arranged in matrix form, each memory cell being connected between a word line pair and between a digit line pair;

a sense circuit including a reference line to which a reference voltage is applied and sense elements connected to both the reference line and the digit line to produce an output in response to a potential on the reference line relative to the potential applied to the memory cell;

first current source means, each connected to the digit line, for supplying a constant current flowing from the digit line through the memory cell to one line of the word line pair;

a word line addressing drive circuit, connected to each line of the word line pairs, for applying the word line addressing voltage to the selected word line;

a voltage source line, connected to the word line addressing drive circuit, through which operation a voltage is applied to the drive circuit; and second current source means, connected to the voltage source line, for providing a constant current therethrough to produce a voltage drop along the voltage source line so as to compensate for the voltage drop developed along the digit line due to the current provided by means of the first current source.

10. A semiconductor memory comprising:

a number of memory cells arranged in matrix form, each memory cell being connected between a word line pair and between a digit line pair;

a sense circuit including a reference line to which a reference voltage is applied and sense elements connected to both the reference line and the digit line to produce an output in response to a potential on the reference line relative to the potential applied to the memory cell;

first current source means, each connected to one line of the word line pair, for producing a constant current flowing from one line of the word line pair through memory cells to the other line of the word line pair;

second current source means, connected to the reference line, for providing a constant current flowing therethrough to produce along the reference line a voltage drop substantially equal to the voltage drop substantially equal to the voltage drop developed along the word line due to the current provided by means of the first current source;

third current source means, each connected to the digit line, for supplying a constant current flowing from the digit line through the memory cell to one line of the word line pair;

fourth current source means, connected to the reference line, for providing a constant current therethrough to produce along the reference line a voltage drop substantially equal to the voltage drop developed along the word line due to the current provided by means of third current source;

a word line addressing drive circuit, connected to each line of the word line pairs, for applying the word line addressing voltage to the selected word line;

a voltage source line, connected to the word line addressing drive circuit, through which operation a voltage is applied to the drive circuit; and fifth current source means, connected to the voltage source line, for providing a constant current to produce a voltage drop along the voltage source line so as to compensate for the voltage drop developed along the digit line due to the current provided by means of the third current source.

* * * * *